(12) United States Patent
Grivna (10) Patent No.: US 9,818,837 B2
(45) Date of Patent: Nov. 14, 2017

(54) PROCESS OF FORMING AN ELECTRONIC DEVICE HAVING AN ELECTRONIC COMPONENT

(71) Applicant: Semiconductor Components Industries, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/565,713

(22) Filed: Dec. 10, 2014

(65) Prior Publication Data
US 2016/0172464 A1   Jun. 16, 2016

(51) Int. Cl.
| H01L 29/66 | (2006.01) |
| H01L 21/308 | (2006.01) |
| H01L 29/78 | (2006.01) |
| H01L 29/739 | (2006.01) |
| H01L 29/417 | (2006.01) |
| H01L 29/08 | (2006.01) |
| H01L 29/40 | (2006.01) |
| H01L 29/423 | (2006.01) |

(52) U.S. Cl.
CPC .... *H01L 29/66348* (2013.01); *H01L 21/3083* (2013.01); *H01L 29/0804* (2013.01); *H01L 29/0821* (2013.01); *H01L 29/408* (2013.01); *H01L 29/41708* (2013.01); *H01L 29/4236* (2013.01); *H01L 29/7397* (2013.01); *H01L 29/7813* (2013.01)

(58) Field of Classification Search
CPC ............. H01L 29/7393–29/7398; H01L 29/66325–29/6634
See application file for complete search history.

(56) References Cited

U.S. PATENT DOCUMENTS

| 7,635,892 B2 * | 12/2009 | Tokuda | H01L 29/0657 257/328 |
| 7,838,926 B2 * | 11/2010 | Tsukuda | H01L 29/0661 257/329 |
| 8,492,260 B2 | 7/2013 | Parsey, Jr. et al. | |
| 8,502,345 B2 * | 8/2013 | Nemoto | H01L 29/739 257/288 |
| 2002/0137264 A1 | 9/2002 | Kao et al. | |

(Continued)

*Primary Examiner* — Xinning Niu
*Assistant Examiner* — Sean Hagan
(74) *Attorney, Agent, or Firm* — Abel Law Group, LLP (57) ABSTRACT

In an embodiment, a process of forming an electronic device can include providing a semiconductor substrate having a first major side and an electronic component at least partly within the semiconductor substrate along the first major side; The process can further include thinning the semiconductor substrate to define a second major surface along a second major side opposite the first major side; and selectively removing a portion of the semiconductor substrate along the second major side to define a trench having a distal surface. The process can further include forming a feature adjacent to or within the trench. The feature can include a doped region, a conductive structure, or the like. In another embodiment, an electronic device can include the semiconductor substrate and a conductive structure within a trench. The conductive layer can laterally surround a pillar within the trench.

18 Claims, 8 Drawing Sheets

(56) References Cited

U.S. PATENT DOCUMENTS

| | | | |
|---|---|---|---|
| 2003/0107041 A1* | 6/2003 | Tanimoto | H01L 29/66068 257/77 |
| 2009/0008708 A1* | 1/2009 | Arai | H01L 29/402 257/330 |
| 2009/0315071 A1* | 12/2009 | Iwabuchi | H01L 29/0653 257/139 |
| 2010/0197127 A1* | 8/2010 | Urano | C25D 5/028 438/584 |
| 2013/0277807 A1 | 10/2013 | Parsey, Jr. et al. | |
| 2014/0070375 A1 | 3/2014 | Grivna | |
| 2015/0123165 A1* | 5/2015 | Omura | H01L 29/4236 257/139 |

* cited by examiner

PROCESS OF FORMING AN ELECTRONIC DEVICE HAVING AN ELECTRONIC COMPONENT

FIELD OF THE DISCLOSURE

The present disclosure relates to electronic devices and processes of forming electronic devices, and more particularly to, electronic devices having electronic components and processes of forming the same.

RELATED ART

An insulated gate bipolar transistor can have a physical layout where the emitter region, body contact, and gate electrode are along one side of a substrate, and the collector region is along an opposite side. Dimensions of the transistor may be reduced to improve performance of the device. Many different techniques have been used in an attempt to reduce the distance between the collector region and a body region of the transistor; however, such attempts are not optimal. Further improvements in insulated gate bipolar transistors are desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 50 V difference maintained between the source and drain of the transistor or emitter and collector of the transistor when the transistor is in an off-state. For example, when the transistor is in an off-state, a 50 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In an aspect, a process of forming an electronic device can include providing a semiconductor substrate that includes an electronic component along a major side of semiconductor substrate. The process can include thinning the opposite major side of the semiconductor substrate and selectively removing a portion of the semiconductor substrate along the opposite major surface to define a trench. After selectively removing the portion of the semiconductor substrate, a variety of different processing operations can be performed to complete formation of the electronic device. For example, a doped region may be formed adjacent to the trench or a conductive structure may be formed within the trench. The process can allow for better process control as dimensions for electronic components are reduced. In a particular embodiment, forming the doped region can be performed from opposite major surface and can provide better control over junction depths as compared to doping along the major surface with the electronic component or forming a buried doped layer early in the process. In another aspect, a conductor can be formed within the trench.

In a further aspect, an electronic device can include a semiconductor substrate having a first major side, a second major side opposite the first major side, and a first major surface along the first major side. The electronic device can include an electronic component region and a peripheral region adjacent to the electronic component region. The semiconductor substrate can be thicker within the first peripheral region than within the electronic component region. The electronic device can further include a conductive structure within a trench along the second major side, wherein the trench extends from the second major surface toward the first major surface, wherein the conductive structure is within the electronic component region and includes a conductive material laterally surrounding a portion of the semiconductor substrate in a form of a pillar within the trench.

Figure 1:
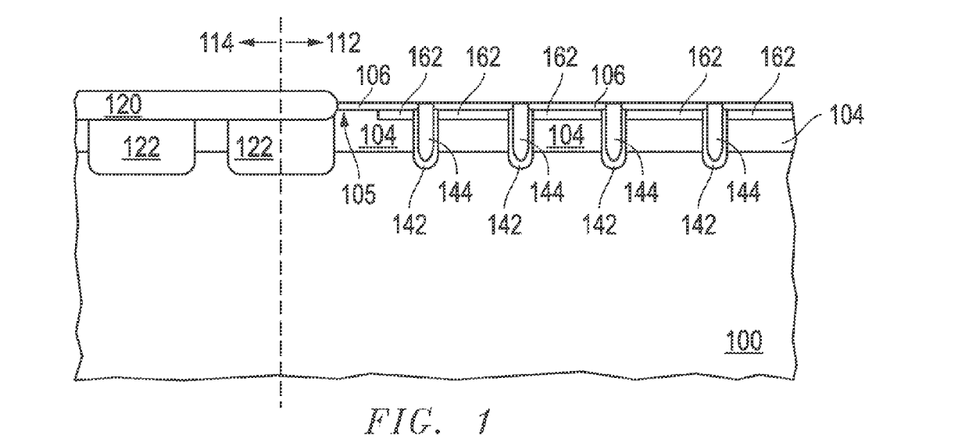
FIG. 1 includes an illustration of a portion of a workpiece including a semiconductor substrate, a well region, a pad layer, a gate electric layer, a gate electrode, and a field isolation region.

FIG. 1 includes an illustration of a cross-sectional view of a portion of a workpiece that includes a semiconductor substrate 100 having a component region 112, where at least one electronic component is formed, and a peripheral region 114 outside the component region 112. The semiconductor substrate 100 can include a Group 14 element (i.e., carbon, silicon, germanium, or any combination thereof) and can be lightly n-type or p-type doped. For the purposes of this specification, heavily doped is intended to mean a peak dopant concentration of at least $1\times10^{19}$ atoms/cm$^3$, and lightly doped is intended to mean a peak dopant concentration of less than $1\times10^{19}$ atoms/cm$^3$. In an embodiment, the semiconductor substrate 100 has a dopant concentration no greater than $1\times10^{19}$ atoms/cm$^3$. In a particular embodiment, the semiconductor substrate 100 is n-type doped. Well regions 104 are formed along a major side of the semiconductor substrate 100 and have a conductivity type opposite the semiconductor substrate 100. The major side from which the well regions 104 are formed is also referred to as the front side. The well regions 104 are lightly doped and have a dopant concentration greater than the semiconductor substrate 100. Portions of the well regions 104 correspond to channel regions of electronic components.

A pad layer 106 and an oxidation-resistant layer (not illustrated) are formed over the well regions 104. The pad layer 106 and the oxidation-resistant layer are patterned, and a field isolation region 120 is formed when the pad layer 106 and the oxidation-resistant layer are removed. The oxidation-resistant layer can then be removed. Doped isolation regions 122 can be formed and extend through the well regions 104 and into the semiconductor substrate 100. The doped isolation regions 122 can have a conductivity type opposite that of the semiconductor substrate 100.

A mask (not illustrated) is formed over the workpiece and defines openings where gate structures will be formed. An etch is performed to remove portions of the pad layer 106, the well regions 104, and semiconductor substrate 100 to define trenches. The trenches may extend only slightly into the semiconductor substrate 100 in order to reduce gate-to-drain capacitance. The etch may be formed as a timed etch or using endpoint detection (for example, based on interferometry) with a timed overetch. The mask can be removed after the trenches are formed. A gate dielectric layer 142 is formed along the exposed surfaces of the trenches. Gate electrodes 144 can be formed depositing a conductive layer and removing portions of the conductive layer lying outside of the trenches. Another mask can be formed and define openings where emitter regions 162 are formed. The emitter regions 162 may also be referred to as source regions. The emitter regions 162 have a conductivity type opposite that of the well regions 104. The emitter regions 162 are heavily doped, and in a particular embodiment are doped with arsenic. The portions of the well regions 104 along the sidewalls of the trenches and between the emitter regions 162 and the semiconductor substrate 100 are channel regions.

Figure 2:
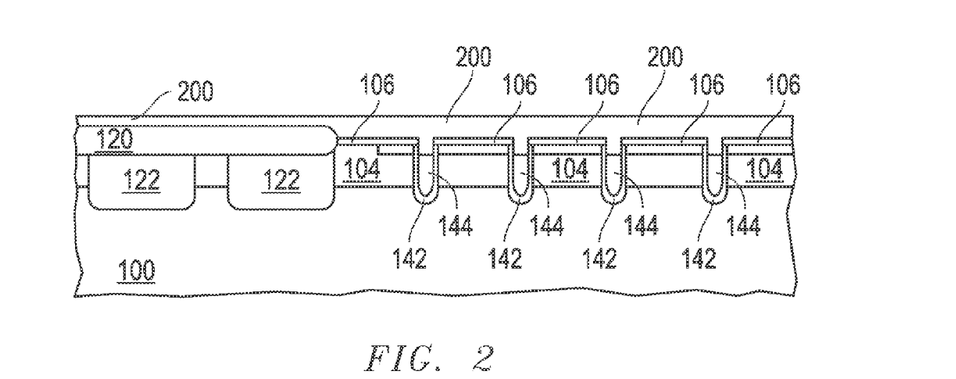
FIG. 2 includes an illustration of the workpiece of FIG. 1 after forming an interlayer dielectric layer.

Referring to FIG. 2, gate electrodes 144 can be recessed within the trenches to reduce gate-to-source capacitance. In the embodiment as illustrated, the gate electrodes span the channel regions and extend slightly beyond the emitter region-well region interface and the well regions-semiconductor substrate interface. An interlevel dielectric (ILD) layer 200 is formed over the workpiece. The ILD layer 200 can include a single film or a plurality of films. The ILD layer 200 can include an oxide, a nitride, or an oxynitride film. In a particular embodiment, the ILD layer 200 can include a relatively thin etch-stop film, a relatively thick oxide film, and a relatively thin antireflective film. Many other variations on the ILD layer 200 are possible, and the ILD layer 200 can be tailor for a particular application.

Figure 3:
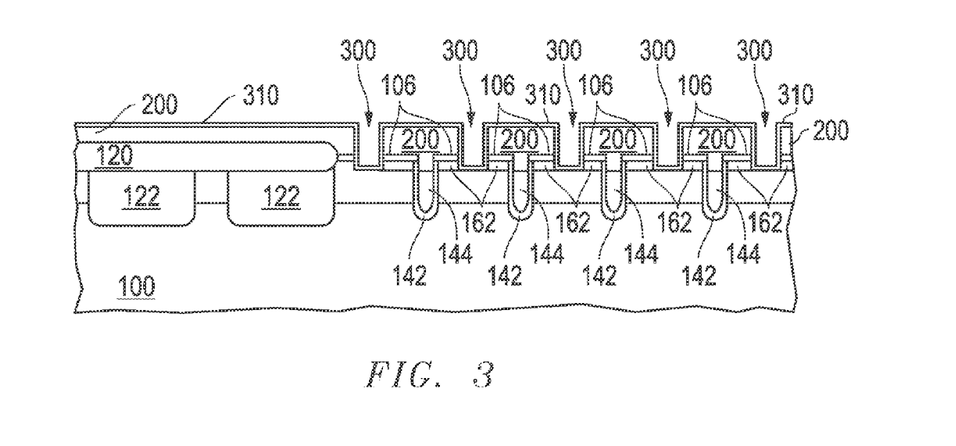
FIG. 3 includes an illustration of the workpiece of FIG. 2 after forming contact openings and a protective layer.

Contact openings may be formed at this point in the process or may be formed later in the process. The description below is based on contact openings being formed before the semiconductor substrate 100 is thinned. Referring to FIG. 3, a mask (not illustrated) is formed and patterned to define openings where contacts are to be made to the emitter regions 162 and the gate electrodes 144. With respect to the emitter regions 162, the ILD layer 200, and the emitter regions 162 are etched to define the contact openings 300 for the emitter regions 162 and for contact regions to the well regions 104. Thus, a portion of the well regions 104 may be etched to ensure that contact is made to the well regions 104. Although not illustrated, the ILD layer 200 is etched to expose portions of the conductive layer that was used to form the gate electrodes 144. After forming the contact openings 300, the mask is removed, and a protective layer 310 can be formed over the ILD layer 200 and within the contact openings 300. In a particular embodiment, the protective layer 310 can provide scratch protection and can include a nitride. In another embodiment, the protective layer 310 can include a different material that can be selectively removed to oxide and silicon. The remainder of figures with the embodiment as illustrated is associated with contact openings formed after back side processing.

Figure 4:
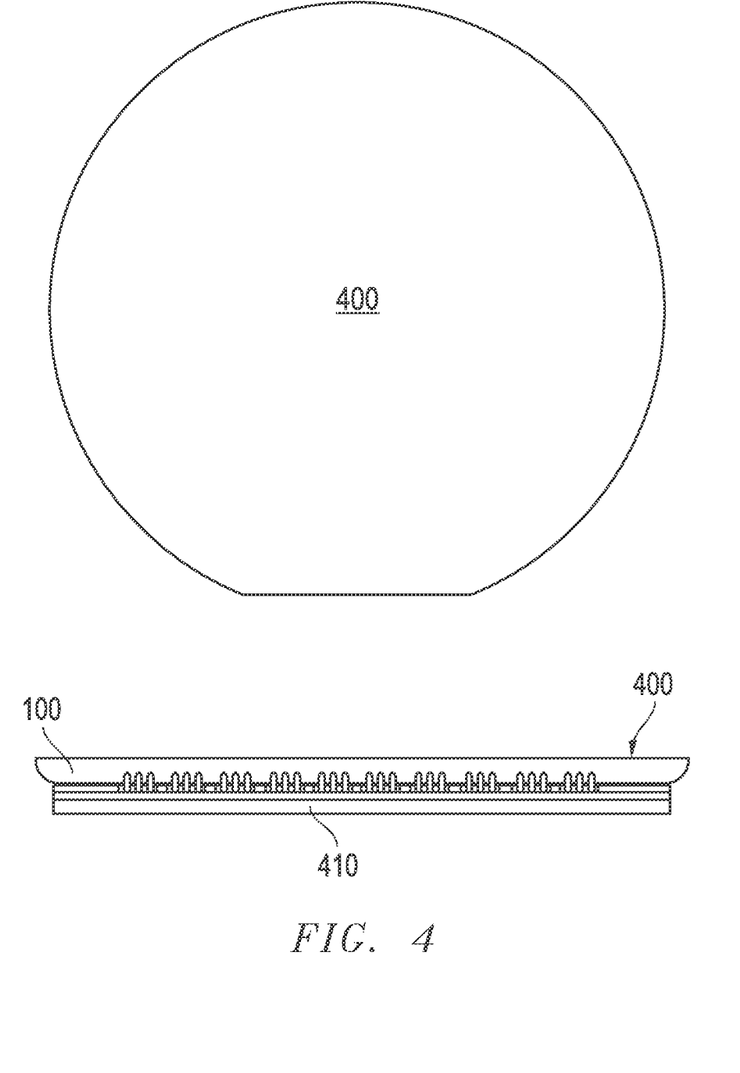
FIG. 4 includes illustrations of the workpiece of FIG. 3 after applying a protective layer and thinning a back side of the semiconductor substrate.

Referring to FIG. 4, another protective layer 410 covers over the ILD layer 210, contact openings 310, if present, emitter regions 162 and gate electrodes 144. The protective layer 410 can be a tape (for example, backgrind tape), an electrostatic carrier, or a polymer coating. The semiconductor substrate 100 can be thinned. In an embodiment, the semiconductor substrate 100 can be thinned by backgrinding or etching the semiconductor substrate 100. The amount of thinning may be affected by mechanical support, electronic component dimensions, or a combination thereof. In an embodiment, before thinning, the semiconductor substrate 100 has a thickness less than 1000 microns, such as less than 800 microns. A desired dimension for the electronic component may be less than 90 microns; however, the semiconductor substrate 100 may not have sufficient mechanical support when the thickness of the semiconductor substrate 100 is the same as the desired dimension. As the width (diameter) of the semiconductor substrate 100 increases, the minimum thickness that provides sufficient mechanical support may likewise increase. In an embodiment, the semiconductor substrate 100 may be thinned such that the thickness after thinning is at least 15%, at least 20%, or at least 25% of the initial semiconductor substrate thickness. In another embodiment, the semiconductor substrate 100 may be thinned such that the thickness after thinning is no greater than 60%, no greater than 50%, or no greater than 40% of the initial semiconductor substrate thickness. In terms of actual dimensions, in an embodiment, the semiconductor substrate 100 may be thinned such that the thickness after thinning is at least 110 microns, at least 150 microns, or at least 200 microns. In another embodiment, the semiconductor substrate 100 may be thinned such that the thickness after thinning is no greater than 400 microns, no greater than 350 microns, or no greater than 300 microns. In another embodiment, the semiconductor substrate 100 may not be thinned. After the semiconductor substrate 100 is thinned, the semiconductor substrate 100 has a major surface 400 along a major side opposite that of the major side with the gate electrodes 144 and emitter regions 162. The major side corresponding to the major surface 400 is also referred to as the back side.

Figure 5:
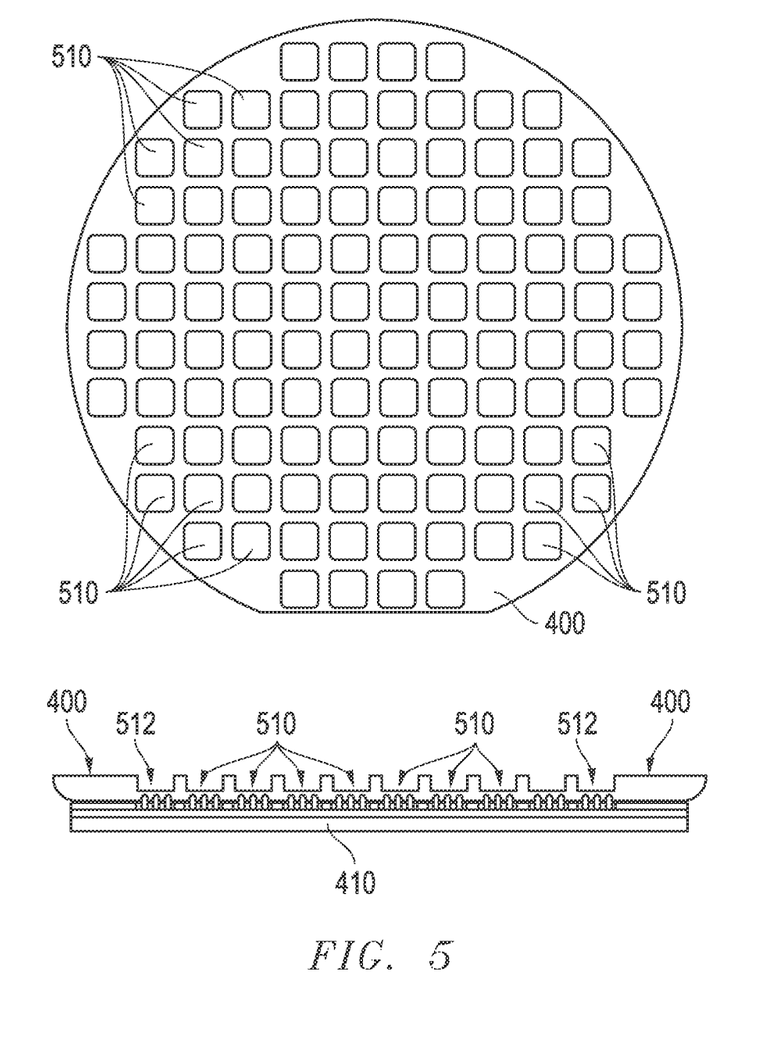
FIG. 5 includes illustrations of the workpiece of FIG. 4 after patterning a back side of the semiconductor substrate to define trenches.

In an embodiment, a mask (not illustrated) is formed over the semiconductor substrate 100, and the semiconductor substrate 100 is selectively removed to define trenches 510 at illustrated in FIG. 5. The trenches 510 are within component regions 112, and the portion of the semiconductor substrate 100 at the major surface 400 corresponds to the peripheral region 114. Each of the trenches 510 extends from the major surface 400 towards the opposite major side of the semiconductor substrate 100, and has a sidewall and a distal surface 512 that may also be referred to as a bottom as seen in FIG. 5. The trench etch may be formed as a timed etch or using endpoint detection (for example, based on interferometry or signal from front side trenches) with a timed overetch.

A remaining thickness of the semiconductor substrate 100 is determined by the desired dimension for the electronic components. Thus, the depths of the trenches 510 are the difference in elevation between the major surface 400 and distal surfaces 512 within the trenches 510 and may depend on the particular electronic parameter. In the illustrated embodiment, lengths of drift regions of the electronic components may be used to determine the depths of the trenches 500. The lengths of the drift regions can depend on the voltage ratings of the electronic components. A relatively shallower trench corresponds to a longer length of the drift region and can support a larger voltage, and a relatively deeper trench corresponds to a shorter length of the drift region and can support a smaller voltage. Thus, the depths of the trenches 500 may vary depending on the electronic characteristics of the electronic components.

In an embodiment, the trenches 510 can have depths that are at least 25%, at least 40%, or at least 50% of the thickness within the peripheral region 114 (after thinning). In another embodiment, the trenches 510 may have a depth that is no greater than 90%, no greater than 80%, or no greater than 70% of the thickness within the peripheral region (after thinning). In terms of actual dimensions, in an embodiment, the trenches 510 can have depths of at least 50 microns, at least 70 microns, or at least 60 microns. In another embodiment, the trenches 510 have depths that are no greater than 300 microns, no greater than 250 microns, or no greater than 200 microns. Although a significant amount of the semiconductor substrate 100 is removed in forming the trenches 510, the peripheral region, corresponding to the major surface 400 in FIG. 5, allows for sufficient mechanical support to allow for proper processing of the workpiece.

Figure 6:
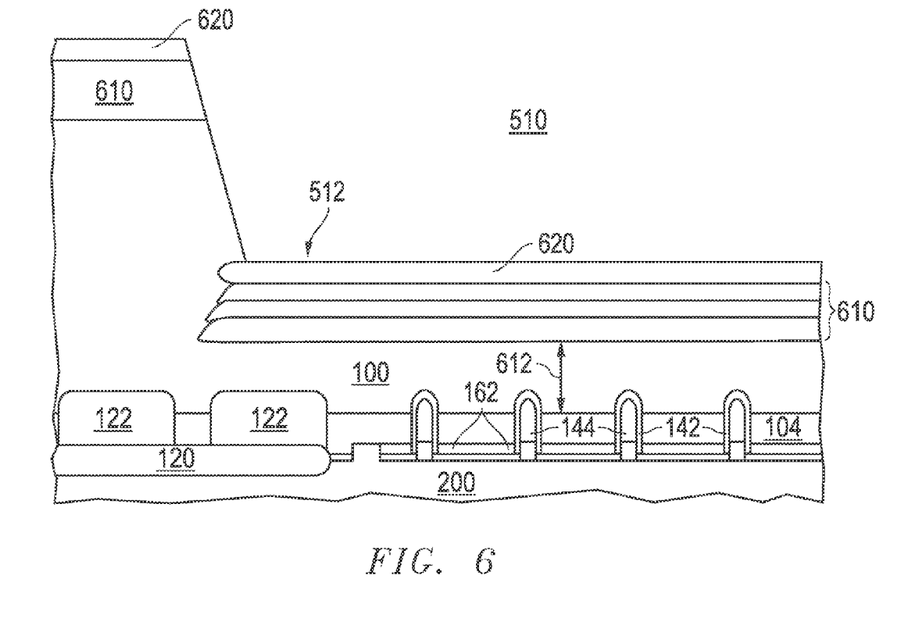
FIG. 6 includes an illustration of the workpiece of FIG. 5 after forming doped regions along a back side of the semiconductor substrate and adjacent to distal surfaces of the trenches.

A variety of different processing operations may be performed using the trenches 510. In the embodiment illustrated, one or more doping operations can be performed. Referring to the embodiment as illustrated in FIG. 6, field-stop regions 610 that set the length of the drift regions of the electronic components can be formed. The field-stop regions 610 can be formed adjacent to the distal surfaces 512 of the trenches 520 using a single implant or with a set of implants, wherein each implant is performed at a different energy to provide different projected ranges into the semiconductor substrate 100. Thus, the field-stop regions 610 can be illustrated as a set of doped regions (near the distal surface) of the trench or as a one region (outside and adjacent to the trench). The lengths 612 of the drift regions will be the distance between the well regions 104 and the field-stop regions 610. The field-stop regions 610 can have doping concentrations in a range of $1\times10^{14}$ atoms/cm$^3$ to $1\times10^{17}$ atoms/cm$^3$. Collector regions 620 can be formed at the distal surfaces 512 of the trenches 510. The collector regions 620 have a dopant concentration of at least $10\times10^{19}$ atoms/cm$^3$. The conductivity type of the field-stop regions 610 are the same as the drift regions of the electronic components and opposite that of the well regions 104, and the conductivity type of collector regions 620 are the same as the well regions 104 and opposite that of the field-stop regions 610. Thus, the electronic components being formed are insulated-gate bipolar transistors. Once the implanted regions 610 and 620 are formed, a thermal activation using high temperature anneal or Rapid Thermal Anneal (900° C. to 1200° C.) can be used to activate the implants and to anneal implant damage. Annealing prior to the temperature sensitive front side interconnections are formed enables activation and implant damage removal without the need for laser annealing, hot implant, or other less optimal activation approaches.

In another embodiment, a different component may be formed. For example, the collector regions 620 may be replaced with a heavily doped n-type drain region. In this embodiment, the electronic component is a vertical insulated gate field-effect transistor. In still another embodiment, different designs of electronic components may be formed using the same semiconductor substrate 100. The depths of the trenches 510, the doping operations, including dopant types, dopant species, implantation parameters, or any combination thereof may be used to allow for different lengths of drift regions. Accordingly, electronic components with different voltage ratings, different types of electronic components, or any combination thereof can be formed on the same semiconductor substrate 100. In another embodiment, the depths of the trenches 510 within the same component region may be different to achieve different breakdown voltages within the same die.

The protective layer 410 is removed and front-side processing continues. In the embodiment in which contact openings are formed before back side processing, the protective layer 310 is removed. In another embodiment in which contact openings have not yet been formed, the contact openings can be formed as previously described. At this point in the process for any of the previously described embodiments, the well regions 104 are exposed along bottom of the contact openings. Note that the emitter regions 162, well regions 104, field-stop regions 610, and collector regions 620 are present but are not illustrated in FIG. 7 to simplify concepts described herein.

A doping operation can be performed to form body contact regions to the well regions 104. Conductive plugs can be formed within the contact openings. Some of the conductive plugs contact the emitter regions 162 and the body contact regions, and other conductive plugs contact the gate electrodes 144. In an alternative embodiment, conductive plugs may not be formed. A conductive layer for interconnects can be formed over the ILD layer 200. The conductive layer contacts the conductive plugs, or if the conductive plugs are not present, the conductive layer contacts the emitter regions 162, the body contact regions, and the gate electrodes 144. Each of the conductive plugs and the conductive layer can include one or more films. For example, the conductive plugs, the conductive layer or both can include an adhesion film, a barrier film, and a conductive film that makes up most of the conductive plugs, conductive layer, or both. The conductive film may include over 90 wt % W for the conductive plugs or over 90 wt % Al or Cu for the conductive layer.

Figure 7:
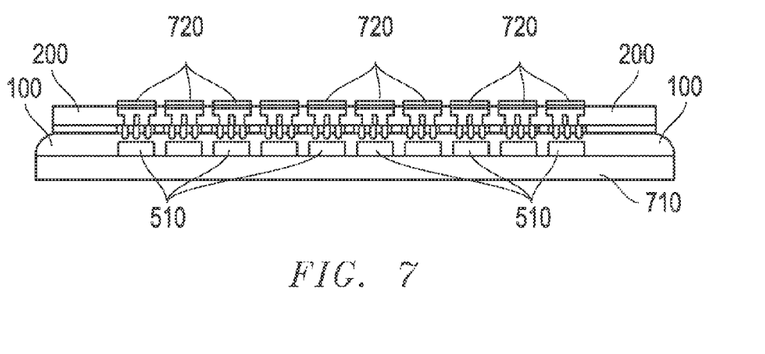
FIG. 7 includes an illustration of the workpiece of FIG. 6 after applying a protective layer and forming interconnects.

Referring to FIG. 7, a protective layer 710 is placed along the second major side of the workpiece and covers the trenches 510. The protective layer 710 can be a tape (for example, backgrind tape), a carrier wafer, an electrostatic carrier, or a polymer coating. As compared to the protective layer 410, the protective layer 710 may be more stiff, if needed or desired for a particular application. The conductive layer is patterned to form interconnects 720. One set of interconnects are electrically connected to the emitter regions 162 and body contact regions, and another set of interconnects are electrically connected to the gate electrodes 144.

Figure 8:
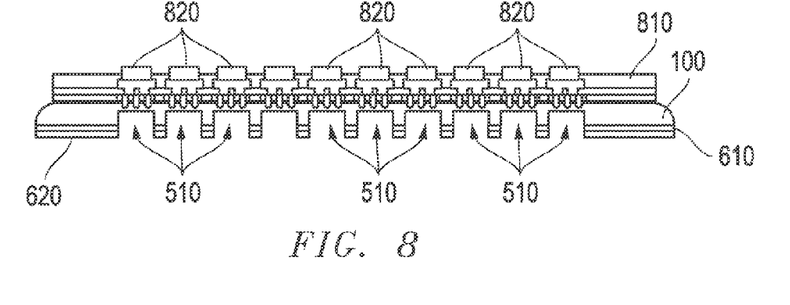
FIG. 8 includes an illustration of the workpiece of FIG. 7 after forming a passivation layer and conductive pads.

Referring to FIG. 8, a passivation layer 810 can be formed over the interconnects 720 and ILD layer 200 and patterned to define openings that expose portions of the interconnects 720. In a particular embodiment, the passivation layer 810 can include a photoimagable polymer, such as polyimide. Conductive pads 820 may be formed within the opening and contact the interconnects 720. The conductive pads 820 can include one or more film. The conductive pads 820 may be formed over each of the interconnects 720 or only some of the interconnects 720. For example, the conductive pads 820 may be formed over the interconnects 720 that are electrically connected to the emitter regions 162, and conductive pads 820 are not formed over the interconnects 720 that are electrically connected to the gate electrodes 144, or vice versa. The protective layer 710 can be removed, and the passivation layer 810 can be cured, if needed or desired for a particular application.

Figure 9:
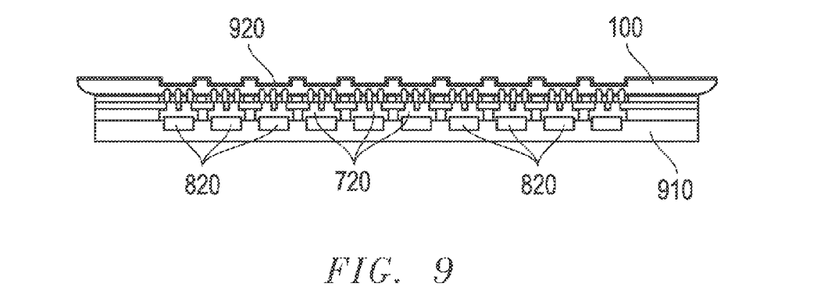
FIG. 9 includes an illustration of the workpiece of FIG. 8 after applying a protective layer, further thinning of the semiconductor substrate, and forming a conductive layer along the back side of the semiconductor substrate.

Referring to FIG. 9, a protective layer 910 is placed along the first major side of the workpiece and covers the passivation layer 810, interconnects 710 and conductive pads 820. The protective layer 910 can be a tape (for example, backgrind tape), an electrostatic carrier, or a polymer coating. The workpiece can be background to achieve a final desired thickness for subsequent singulation. In an embodiment, most or all of the semiconductor substrate 100 within the peripheral area that lies at an elevation higher than the distal surfaces of the trenches 510 may be removed. In an embodiment, the elevational differences between the ground surface and the distal surfaces 512 within the trenches 510 may be no greater than 50 microns, no greater than 20 microns, or no greater than 10 microns. The collector regions 620 and field-stop regions 610 adjacent to the distal surfaces 5112 of the trenches 510 are not removed. A conductive layer 920 can be formed along the second major side after the removal. The conductive layer 920 is electrically connected to the collector regions 620. In a particular embodiment, the conductive layer 920 may include one or more films and may help with subsequent soldering to a terminal of a packaging substrate. In an alternate embodiment, the conductive layer 920 can be applied prior to backgrind.

Figure 10:
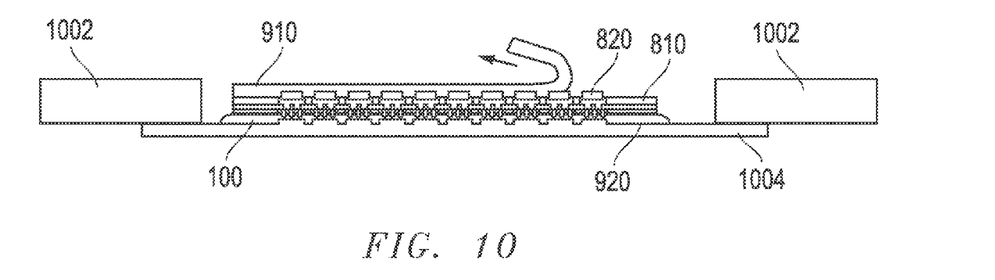
FIG. 10 includes an illustration of the workpiece of FIG. 9 after placing the workpiece on a substrate mount and removing the protective layer.

The workpiece can be placed on a substrate mount for singulation, as illustrated in FIG. 10. The substrate mount can include a frame 1002 and a tape 1004. The protective film 910 is removed before singulation is performed. The workpiece can be singulated, and die resulting from the singulation can be assembled into packaged electronic devices.

Figure 11:
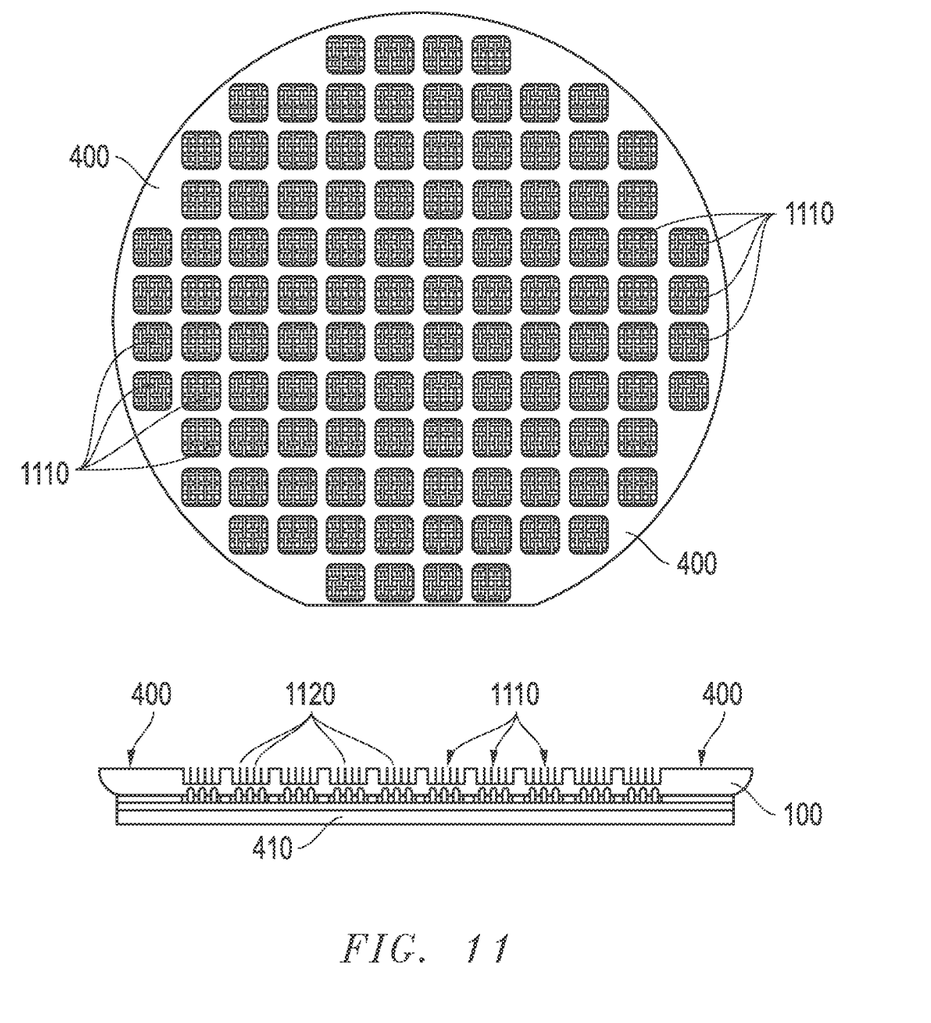
FIG. 11 includes illustrations of a portion of a workpiece after patterning a back side of the semiconductor substrate to define trenches having pillars within the trenches in accordance with an alternative embodiment.

In another embodiment, trenches along the second major surface can include pillars. Processing can be performed as described and illustrated in FIGS. 1 to 4. A mask (not illustrated) can be formed over the semiconductor substrate 100, and the semiconductor substrate 100 is patterned to define trenches 1110 as illustrated in FIG. 11. The trenches 1110 are within component regions, and the portion of the semiconductor substrate 100 corresponding to the major surface 1100 corresponds to the peripheral region. Considerations in determining the depths of the trenches 1110 are substantially the same as previously described with respect to the trenches 510.

Figure 12:
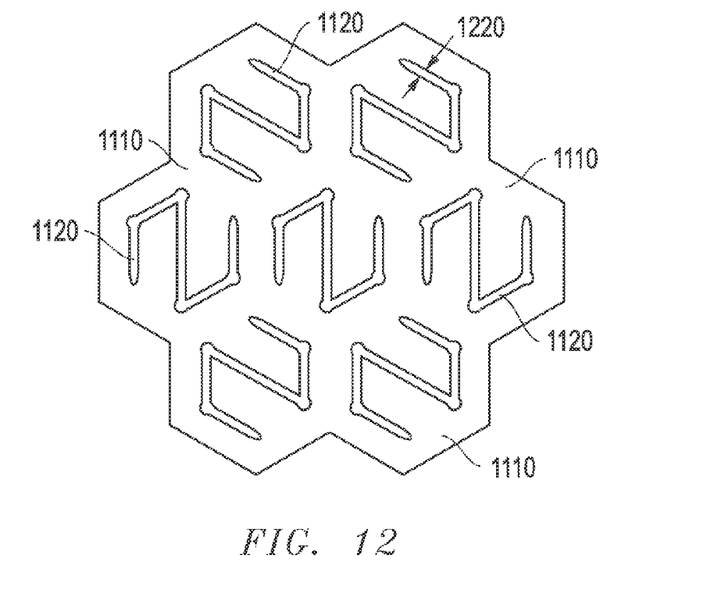
FIG. 12 includes an illustration of an enlarged portion the workpiece of FIG. 11 demonstrating an exemplary, non-limiting shape of pillars within a trench.

Unlike the trenches 510, pillars 1120 are within the trenches 1110. The pillars 1120 correspond to remaining portions of the semiconductor substrate 100 within the trenches 1110 that are not etched. Compare to the trenches 510 that do not have pillars and can be referred to as cavities. FIG. 12 includes an enlarged view of a portion of one of the trenches 1110 including exemplary pillars 1120. Other designs of pillars are described and illustrated in U.S. Pat. No. 8,492,260 and US 2014/0070375, both of which are incorporated herein regarding their teachings of the formation and shapes of pillars (also referred to as features).

Figure 13:
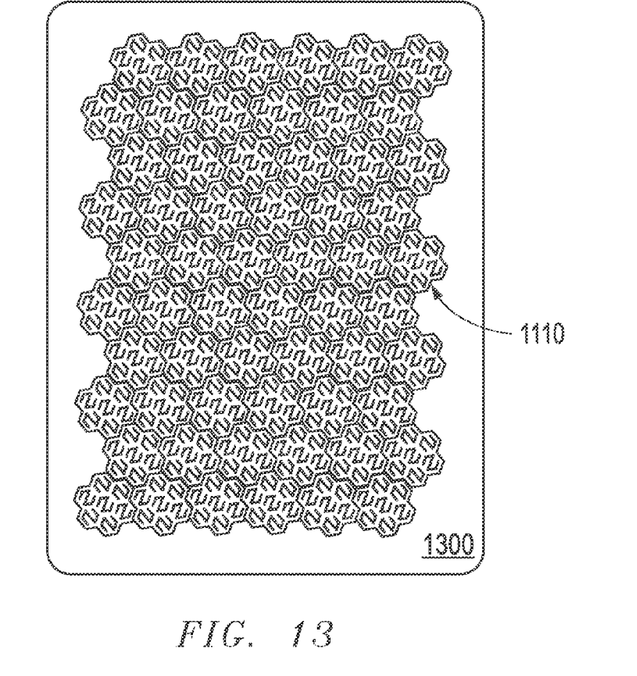
FIG. 13 includes an illustration of the workpiece of FIG. 11 demonstrating an exemplary, non-limiting layout for a portion of an electronic device.

In a particular embodiment, widths 1220 of the pillars 1120 can be controlled to allow sufficient migration of dopant beneath the pillars if needed or desired. The widths 1220 may be no greater than 9 microns, no greater than 5 microns, or no greater than 2 microns. The widths 1220 can be sufficiently wide to allow for sufficient mechanical support. The widths 1220 may be at least 0.1 micron, at least 0.2 micron, or at least 0.5 micron. FIG. 13 includes a top view of a trench 1110 that corresponds to a component region and a peripheral region 1300 surrounding the trench 1110.

Figure 14:
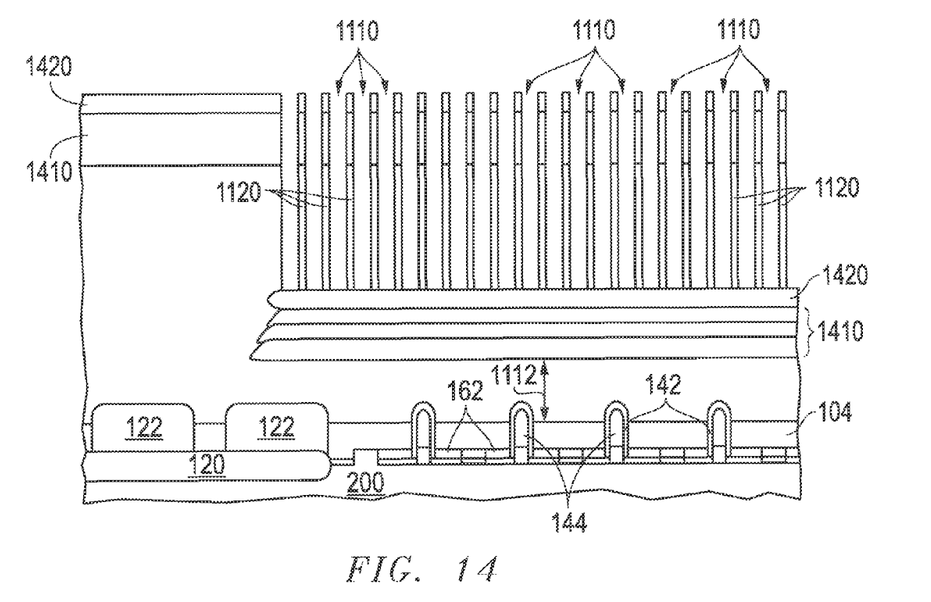
FIG. 14 includes an illustration of the workpiece of FIG. 11 after forming doped regions along a back side of the semiconductor substrate and adjacent to distal surfaces of the trenches.

Similar to previously described embodiments, a variety of different processing operations may be performed. In the embodiment illustrated, one or more doping operations can be performed. A field-stop region 1410 can be formed adjacent to the distal surfaces of the trenches 1110 using a single implant or with a set of implants, wherein each implant is performed at a different energy to provide different projected ranges into the semiconductor substrate 100. The length 1112 of the drift region will be the distance between the well regions 104 and the field-stop regions 1410. The field-stop regions 1410 can have a doping concentration in a range of $1 \times 10^{16}$ atoms/cm$^3$ to $1 \times 10^{19}$ atoms/cm$^3$. Collector regions 1420 can be formed at the distal surfaces of the trenches 1110. The collector regions 1420 have dopant concentrations of at least $10 \times 10^{19}$ atoms/cm$^3$. The conductivity type of the field-stop regions 1410 is the same as the drift regions of the electronic components and opposite that of the well regions 104, and the conductivity type of collector regions 1420 is the same as the well regions 104 and opposite that of the field-stop regions 1410. Thus, the electronic components are an insulated-gate bipolar transistors.

In another embodiment, a different component may be formed. For example, one or more of the collector regions 1420 may be replaced with a heavily doped n-type drain region. In this embodiment, the electronic component is a vertical insulated gate field-effect transistor. In still another embodiment, different designs of electronic components may be formed using the same semiconductor substrate. The depths of the trenches 1110, the doping operations, including dopant types, dopant species, implantation parameters, or any combination thereof may be used to allow for different lengths of drift regions. Accordingly, electronic components with different voltage ratings, different types of electronic components, or any combination thereof can be formed on the same semiconductor substrate.

Figure 15:
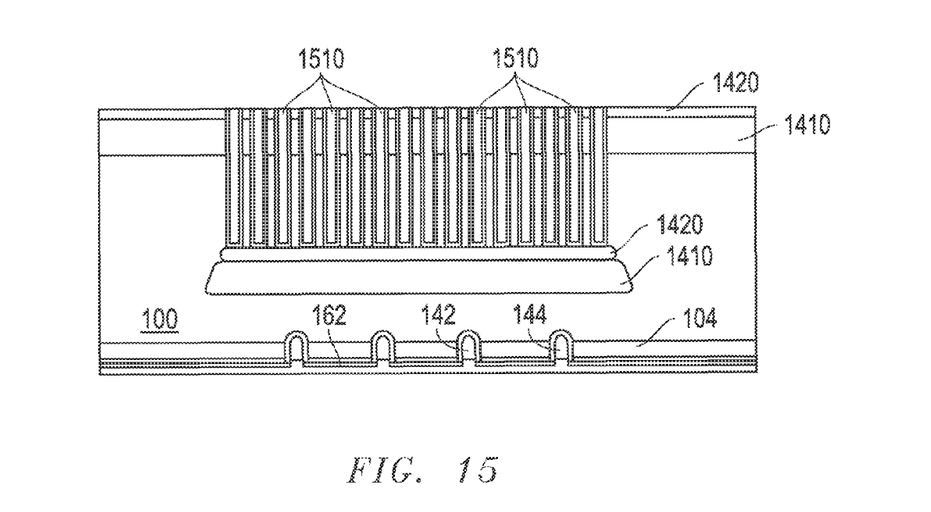
FIG. 15 includes an illustration of the workpiece of FIG. 14 after forming a conductive layer within the trenches.

A conductive layer 1510 is formed along the major side and within the trenches 1110. The conductive layer can have one or more films that include a metal or a semiconductor material. The conductive layer 1510 can partly or completely fill the trenches. If the conductive layer 1510 partly fills the trenches, remaining portions of the trenches can be filled with an insulator or a material that makes up most of the semiconductor substrate 100 (for example, silicon). Portions of the conductive layer 1510 lying outside the trenches 1110 can be removed to form conductive structures, if needed or desired.

Processing can continue substantially the same as previously illustrated and described with respect to FIGS. 7 to 9. The interconnects 720, passivation layer 810, and conductive pads 820 can be formed as previously described. If needed or desired, a portion of the workpiece along the major surface with the trenches 1110 and conductive layer can be removed. The conductive layer 920 can be formed along the second major side. The conductive layer 920 is electrically connected to the collector regions 1420 and contacts the conductive layer 1510 within the trenches 1110. In a particular embodiment, the conductive layer 920 may include one or more films and may help with subsequent soldering to a terminal of a packaging substrate. From this point, processing continues as previously described.

Embodiments as described herein allow for more control over device dimensions and performance and a reduced likelihood of implant-induced damage within more sensitive portions of the electronic device, such as the well regions 104, the drift regions, and the gate dielectric layer 142. In particular, the dopants for the field-stop regions 610 and 1410 and the collector regions 620 and 1420 are formed from the major side of the semiconductor substrate 100 opposite the major surface of where the well regions 104 and gate dielectric layer 142 are formed. Thus, ions do not pass though the well regions 104 and drift region in order to form the field-stop regions 610 and 1410 and the collector regions 620 and 1420.

Better substrate-to-substrate control over dimensions can be achieved. As compared to the processing described in US 2002/0137264, embodiments as described herein do not require the formation of a buried doped region early in the process and prior to the interconnection formation. Thus, more precise control and activation over doped regions, particularly the field-stop regions 610 can be achieved because the field-stop regions 610 are formed later in the process. Furthermore, by thinning the semiconductor substrate 100 before forming the trenches allows for shorter etching time for the trenches and better control of the depths of the trenches.

Less implant damage in sensitive regions of the electronic device, better process control, and high temperature activation allows higher quality of electronic devices to be formed that have less variation is performance between electronic devices formed from different semiconductor substrates in the same or different production lots.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. A process of forming an electronic device comprising:

providing a semiconductor substrate having a first major side and an electronic component at least partly within the semiconductor substrate along the first major side;

thinning the semiconductor substrate to define a second major surface along a second major side opposite the first major side;

selectively removing a portion of the semiconductor substrate along the second major side to define a trench having a distal surface, wherein:

the trench extends from the second major surface and only partly through a thickness of the semiconductor substrate; and selectively removing is performed after thinning the semiconductor substrate; and forming a doped region adjacent to a distal surface of the trench, wherein forming the doped region is performed along the second major side of the semiconductor substrate after thinning the semiconductor substrate.

Item 2. The process of item 1, further comprising forming a contact opening to the electronic component before thinning the semiconductor substrate.

Item 3. The process of item 1, further comprising forming a conductive structure within the trench.

Item 4. The process of item 1, wherein the doped region includes a field-stop region.

Item 5. The process of item 4, further comprising forming a collector region along the distal surface of the trench, wherein the collector region has a conductivity type opposite that of the field-stop region, and the field-stop region is disposed between the collector region and the first major side of the semiconductor substrate.

Item 6. The process of item 1, wherein selectively removing defines the trench having a portion of the semiconductor substrate in a form of a pillar extending from the distal surface of the trench.

Item 7. The process of item 6, wherein forming a conductive structure within the trench, wherein the conductive layer includes a conductive material that laterally surrounds the pillar.

Item 8. The process of item 1, wherein selectively removing defines the trench that is a cavity not having a portion of the semiconductor substrate that extends from the distal surface of the trench and is spaced apart from a sidewall of the trench.

Item 9. The process of item 8, wherein covering the cavity before forming an interconnect.

Item 10. The process of item 1, further comprising forming an interconnect to a portion of the electronic component, wherein forming the interconnect is performed after forming the field-stop region.

Item 11. The process of item 1, wherein the electronic component includes at least portions of an insulated gate bipolar transistor.

Item 12. The process of item 1, further comprising:
activating dopant within the doped region; and
forming an interconnect to the along the first major surface after activating the dopant.

Item 13. The process of item 1, wherein:
providing the semiconductor substrate and an electronic component comprises forming a well region, an emitter region of an insulated gate bipolar transistor, and a gate electrode of the insulated gate bipolar transistor along the first major side of the semiconductor substrate, wherein the well region has a conductivity type opposite the emitter region;
the process further comprises:
covering the first major side of the semiconductor substrate after forming the emitter region and the gate electrode and before thinning the semiconductor substrate;
forming a doped region along the distal surface of the trench, wherein the doped region has a conductivity type opposite that of the field-stop region;
forming a conductive layer within the trench and electrically connected to the doped region, wherein the doped region is disposed between the field-stop region and the conductive structure; and
forming interconnects to the emitter region and the gate electrode.

Item 14. A process of forming an electronic device comprising:
providing a semiconductor substrate having a first major side, a second major side opposite the first major side, and an electronic component at least partly within the semiconductor substrate along the first major side;
thinning the semiconductor substrate along the second major side;
selectively removing a portion of the semiconductor substrate along the second major side to define a trench that extends from the only partly through a thickness of the semiconductor substrate, wherein selectively removing is performed after thinning the semiconductor substrate;
forming an interconnect to the electronic component, wherein forming the interconnect is performed after thinning the semiconductor substrate.

Item 15. The process of item 14, further comprising forming a field-stop region adjacent to the trench after selectively removing the portion of the semiconductor substrate and before forming the interconnect.

Item 16. The process of item 15, further comprising forming a doped region along a distal surface of the trench, wherein:
the doped region has a conductivity type opposite that of the field-stop region; and
the field-stop region is disposed between the doped region and the first major side of the semiconductor substrate.

Item 17. The process of item 16, further comprising forming a conductive material within the trench that is electrically connected to the doped region.

Item 18. An electronic device comprising:
a semiconductor substrate having a first major side, a second major side opposite the first major side, and a first major surface along the first major side;
an electronic component region;
a first peripheral region adjacent to the electronic component region, wherein the semiconductor substrate is thicker within the first peripheral region than within the electronic component region; and
a conductive structure within a trench along the second major side, wherein the trench extends from the second major surface toward the first major surface, wherein the conductive structure is within the electronic component region and includes a conductive material laterally surrounding a portion of the semiconductor substrate in a form of a pillar within the trench.

Item 19. The electronic device of item 18, wherein the electronic component includes a power transistor.

Item 20. The electronic device of item 18, wherein the electronic component includes an insulated gate bipolar transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device having a component region and a peripheral region, the process comprising:
   providing a semiconductor substrate having a first major side and an electronic component at least partly within the semiconductor substrate along the first major side;
   thinning the semiconductor substrate to define a second major surface along a second major side opposite the first major side;
   selectively removing a portion of the semiconductor substrate along the second major side to define a trench having a distal surface, wherein the trench extends from the second major surface and only partly through a thickness of the semiconductor substrate;
   forming a first doped region adjacent to a distal surface of the trench and within the component region; and
   forming a second doped region outside the trench, within the peripheral region, and along the second major side of the semiconductor substrate,
   wherein the first and second doped regions have a same conductivity type, forming the first and second doped regions is performed after thinning the semiconductor substrate, and the first and second doped regions are non-contiguous with respect to each other,
   wherein the second doped region is directly adjacent a third doped region within the peripheral region and having a conductivity type opposite that of the second region.

2. The process of claim 1, further comprising forming a contact opening to the electronic component before thinning the semiconductor substrate.

3. The process of claim 1, further comprising forming a conductive structure within the trench.

4. The process of claim 1, wherein the first doped region includes a first field-stop region, and the second doped region includes a second field-stop region.

5. The process of claim 4, further comprising forming a collector region along the distal surface of the trench, wherein the collector region has a conductivity type opposite that of the field-stop region, and the field-stop region is disposed between the collector region and the first major side of the semiconductor substrate.

6. The process of claim 1, wherein selectively removing defines the trench having a portion of the semiconductor substrate in a form of a pillar extending from the distal surface of the trench.

7. The process of claim 6, further comprising forming a conductive structure within the trench, wherein the conductive layer includes a conductive material that laterally surrounds the pillar.

8. The process of claim 1, wherein selectively removing defines the trench that is a cavity.

9. The process of claim 8, further comprising covering the cavity before forming an interconnect.

10. The process of claim 4, further comprising forming an interconnect to a portion of the electronic component, wherein forming the interconnect is performed after forming the first and second field-stop regions.

11. The process of claim 1, wherein the electronic component includes at least portions of an insulated gate bipolar transistor.

12. The process of claim 1, wherein selectively removing is performed after thinning the semiconductor substrate.

13. The process of claim 4, wherein:
   providing the semiconductor substrate and an electronic component comprises forming a well region, an emitter region of an insulated gate bipolar transistor, and a gate electrode of the insulated gate bipolar transistor along the first major side of the semiconductor substrate, wherein the well region has a conductivity type opposite the emitter region;
   the process further comprises:
   covering the first major side of the semiconductor substrate after forming the emitter region and the gate electrode and before thinning the semiconductor substrate;
   forming a fourth doped region along the distal surface of the trench, wherein the fourth doped region has a conductivity type opposite that of the first field-stop region;
   forming a conductive layer within the trench and electrically connected to the fourth doped region, wherein the fourth doped region is disposed between the first field-stop region and the conductive structure; and
   forming interconnects to the emitter region and the gate electrode.

14. The process of claim 1, further comprising:
   placing a protective layer along the second major side of the substrate after forming the first doped region;
   forming a first interconnect to the electronic component, wherein the first interconnect is along the first major side of the semiconductor substrate and formed after placing the protective layer along the second major side;
   removing the protective layer after forming the first interconnect; and
   forming a second interconnect to the electronic component, wherein the second interconnect is along the second major side of the substrate and formed after removing the protective layer.

15. A process of forming an electronic device having a component region and a peripheral region, the process comprising:
   providing a semiconductor substrate having a first major side and an electronic component at least partly within the semiconductor substrate along the first major side;
   thinning the semiconductor substrate to define a second major surface along a second major side opposite the first major side;
   selectively removing a portion of the semiconductor substrate along the second major side to define trenches in the component portion and not in the peripheral region, each trench having a distal surface, wherein remaining portions of the semiconductor substrate within the trenches are not removed during selectively removing, wherein the trenches extend from the second major surface and only partly through a thickness of the semiconductor substrate to a depth of at least 50 microns;
   forming a first doped region adjacent to a distal surface of the trench and within the component region;
   forming a second doped region outside the trench, within the peripheral region, and along the second major side of the semiconductor substrate, wherein the first and second regions are non-contiguous;
   forming a conductive layer along the second major side and within the trench to fill the trenches; and
   removing all of the conductive layer lying outside the trenches to form conductive structures that extends from the second major surface toward the first doped region, wherein in a finished electronic device, the conductive structures extend only partly, and not completely, through the semiconductor substrate.

16. The process of claim 15, wherein the first doped region is a collector region, and the conductive structure is electrically connected to the collector region.

17. The process of claim 16, further comprising forming a field-stop region adjacent to the trench after selectively removing the portion of the semiconductor substrate, wherein:
- the collector region has a conductivity type opposite that of the field-stop region; and
- the field-stop region is disposed between the collector region and the first major side of the semiconductor substrate.

18. The process of claim 15, wherein the remaining portion of the substrate includes a pillar.

* * * * *